United States Patent
Zhang et al.

(10) Patent No.: US 10,942,099 B2
(45) Date of Patent: Mar. 9, 2021

(54) SELF-HEALING METHOD FOR FRACTURED SIC SINGLE CRYSTAL NANOWIRES

(71) Applicant: DALIAN UNIVERSITY OF TECHNOLOGY, Liaoning (CN)

(72) Inventors: Zhenyu Zhang, Liaoning (CN); Junfeng Cui, Liaoning (CN); Yuefeng Du, Liaoning (CN); Dongming Guo, Liaoning (CN)

(73) Assignee: Dalian University of Technology, Liaoning (CN)

( * ) Notice: Subject to any disclaimer, the term of this patent is extended or adjusted under 35 U.S.C. 154(b) by 135 days.

(21) Appl. No.: 16/340,356

(22) PCT Filed: Nov. 15, 2017

(86) PCT No.: PCT/CN2017/111166
§ 371 (c)(1),
(2) Date: Apr. 8, 2019

(87) PCT Pub. No.: WO2019/090797
PCT Pub. Date: May 16, 2019

(65) Prior Publication Data
US 2020/0080921 A1    Mar. 12, 2020

(30) Foreign Application Priority Data
Nov. 9, 2017   (CN) .......................... 201711094034.1

(51) Int. Cl.
*G01N 3/08* (2006.01)
*C30B 29/36* (2006.01)
(Continued)

(52) U.S. Cl.
CPC ............... *G01N 3/08* (2013.01); *C30B 29/36* (2013.01); *C30B 29/62* (2013.01); *G01N 23/06* (2013.01)

(58) Field of Classification Search
CPC .......... G01N 3/08; G01N 23/06; C30B 29/36; C30B 39/62
See application file for complete search history.

(56) References Cited

U.S. PATENT DOCUMENTS

| 2015/0255227 A1* | 9/2015 | Chen ...................... C08G 69/48 361/502 |
| 2015/0360408 A1* | 12/2015 | Menceloglu ......... D01D 5/0007 428/394 |
| 2020/0018670 A1* | 1/2020 | Zhang ................... C01B 32/956 |

FOREIGN PATENT DOCUMENTS

| CN | 101113946 A | 1/2008 |
| CN | 201488957 U | 5/2010 |

(Continued)

OTHER PUBLICATIONS

Zhang et al., "Study on Atom-Scale Nanomechanics and Structure under In-Situ/Application Field," Materials China, vol. 28, No. 1, Jan. 2009, 11 pages, with English abstract.

*Primary Examiner* — David Z Huang
(74) *Attorney, Agent, or Firm* — Muncy, Geissler, Olds & Lowe, P.C.

(57) ABSTRACT

A self-healing method for fractured single crystal SiC nanowires. A hair in a Chinese brush pen of yellow weasel's hair moves and transfers nanowires, which are placed on an in-situ TEM mechanical microtest apparatus. An in-situ nanomechanical tension test is realized. The nanowires are loaded. Displacement is 0-200 nm. Fracture strength of the single crystal nanowires is 12-15 GPa. After the nanowires are fractured, unloading causes slight contact between the fractured end surfaces, electron beam is shut off, and self- (Continued)

healing of the nanowires is conducted in a vacuum chamber. Partial recrystallization is found at a fracture after self-healing through in-situ TEM representation. A fracture strength test is conducted again after self-healing. A fractured position after healing is the same as the position before healing. The fracture strength of the single crystal nanowires after self-healing is 1-2.5 GPa. The recovery ratio of the fracture strength is 10-20%.

1 Claim, 1 Drawing Sheet

(51) Int. Cl.
  *C30B 29/62* (2006.01)
  *G01N 23/06* (2018.01)

(56) References Cited

FOREIGN PATENT DOCUMENTS

| CN | 107219243 A | 9/2017 |
| WO | WO-2011/053346 A1 | 5/2011 |

\* cited by examiner

SELF-HEALING METHOD FOR FRACTURED SIC SINGLE CRYSTAL NANOWIRES

TECHNICAL FIELD

The present invention relates to a self-healing method for fractured single crystal SiC nanowires, specifically relates to long service life, reliability and stability of semiconductor devices and equipment, and particularly relates to long service life and reliability of SiC semiconductor devices and equipment.

BACKGROUND

SiC has unique physical, mechanical and electronic performance, such as high heat transfer coefficient, high breakdown voltage and high band gap width. Therefore, SiC becomes the most widely used material for high-energy and high-temperature electronic, photoelectric and electromechanical devices. SiC is also the most promising material for the next generation of electronic devices. SiC is widely used in high temperature, high energy, high voltage, high current, high frequency and other harsh environments and extreme conditions. These extreme conditions greatly increase the possibility of fracture of SiC material. Once SiC is fractured, the devices will fail. For SiC devices and equipment used in high speed and high temperature environments, such as aviation, aerospace, nuclear energy, high-speed engines and other fields, disastrous consequences will be caused. Therefore, a self-healing method for fractured SiC without external intervention is an important guarantee for long service life and high reliability of high-performance SiC devices and equipment, and is widely concerned.

But at present, the solid self-healing method without external intervention has not been reported internationally. The self-healing method mainly studies polymers and their composites. The most common self-healing method is to use microencapsulation technology to inject a self-healing agent into the polymers and their composites in advance and release the self-healing agent by a microcapsule after local fracturing, so as to heal the fractured place. This method has the disadvantage that the self-healing agent of the microcapsule can only be released once generally, and reaches microcracks according to the capillary action and cannot reach all places. The self-healing polymers and their composites manufactured by this method are very expensive and are not mature in the manufacturing processes. Furthermore, this self-healing method is an invasive healing method that reduces the performance of the material and is only applicable to some specific polymers and their composites, not applicable to semiconductors and SiC devices. SiC is mainly used in extreme conditions such as high temperature and high energy. This polymer healing agent is difficult to meet the service requirements of such harsh environments.

SUMMARY

The present invention adopts a self-healing method for fractured single crystal SiC nanowires to realize self-healing of single crystal nanowires without external intervention.

The present invention adopts the following technical solution:

A self-healing method for fractured single crystal SiC nanowires is provided. A yellow weasel's hair in a Chinese brush pen of yellow weasel's hair moves and transfers nanowires; the nanowires are placed on an in-situ mechanical microtest apparatus of a TEM; an in-situ nanomechanical tension test is realized in the TEM; the nanowires are loaded; loading rate is 0.5-15 nm/s; displacement is 0-200 nm; and fracture strength of the single crystal nanowires is 12-15 GPa. After the nanowires are fractured, unloading causes a slight contact between the fractured end surfaces; the electron beam is shut off; and self-healing of the nanowires is conducted after waiting for 15-30 min in a vacuum chamber of the TEM. Partial recrystallization is found at a fracture after self-healing through in-situ representation of the TEM; a fracture strength test is conducted again after self-healing; and a fractured position after healing is the same as the position before healing. The fracture strength of the single crystal nanowires after self-healing is 1-2.5 GPa; and the recovery ratio of the fracture strength is 10-20%. The present invention provides a method for realizing self-healing for fractured single crystal SiC nanowires without external intervention.

Single crystal SiC nanowires have a diameter of 60-90 nm. single crystal SiC is the most widely used SiC material. Considering the dual applications of a microelectromechanical system and a nanoelectromechanical system and microscopic and macroscopic applications, the range of the single crystal nanowires is selected as 60-90 nm.

One end of a Chinese brush pen of yellow weasel's hair is fixed to a mobile platform of an optical microscope using conductive silver epoxy; the Chinese brush pen realizes millimeter movement and micrometer movement through the mobile platform; a yellow weasel's hair at the other end of the Chinese brush pen of yellow weasel's hair moves and transfers nanowires to place the nanowires on an in-situ mechanical microtest apparatus of a TEM. The yellow weasel's hair has certain tenacity and strength. Therefore, the yellow weasel's hair in the Chinese brush pen of yellow weasel's hair is selected as an operation tool. The Chinese brush pen of yellow weasel's hair is fixed to the mobile platform of the optical microscope. The Chinese brush pen of yellow weasel's hair realizes three-dimensional macroscopic millimeter movement and microscopic micrometer movement through coarse control and fine control knobs of the mobile platform, thereby accurately operating the single crystal SiC nanowires. The single crystal SiC nanowires are moved and transferred by means of electrostatic attraction between the yellow weasel's hair and the nanowires. The nanowires are operated as follows: on the mobile platform of another optical microscope, the nanowires are placed on an objective lens, and are operated after clear focusing and eyepiece imaging.

Both ends of the nanowires are fixed to the microtest apparatus using conductive silver epoxy. The nanowires are placed on the microtest apparatus in the optical microscope using the yellow weasel's hair, are fixed using the conductive silver epoxy and are solidified. The method can effectively avoid the pollution and damage to the nanowires caused by traditional operation of focusing ion beam and electron beam and deposition and fixation of the nanowires.

The microtest apparatus is installed on an in-situ nanomechanical test system of the TEM; and an in-situ nanomechanical tension test is realized in the TEM. Loading and unloading curves can be obtained from the in-situ tension test of the TEM, and a high-resolution in-situ tension video of the TEM can be recorded to obtain a high-resolution TEM micrograph corresponding to a mechanical performance curve.

The nanowires are loaded; a displacement control mode is used; loading rate is 0.5-15 nm/s; and displacement is 0-200 nm. The displacement control mode is that appropriate displacement is supplied according to SiC of hard and brittle materials which are easy to fracture under stress, to test the fracture strength of the nanowires. The loading rate is 0.5-15 nm/s to obtain a mechanical curve of the SiC nanowires and a corresponding high-resolution TEM micrograph of atomic dimension. The displacement of 0-200 nm is a displacement supplied according to the length of the corresponding nanowires. The nanowires can be fractured to obtain the fracture strength of the single crystal SiC nanowires.

The fracture strength of the single crystal nanowires is 12-15 GPa. The fracture strength of the nanowires is an in-situ TEM mechanical test result obtained according to a maximum force of fracturing the nanowires and a fracture area.

After the nanowires are fractured, unloading causes a slight contact between the fractured end surfaces; the load of the end surfaces is 0; the electron beam is shut off; and self-healing of the nanowires is conducted after waiting for 15-30 min in a vacuum chamber of the TEM. Self-healing of the single crystal SiC nanowires does not need external intervention. As long as the fractured end surfaces come into slight contact, the nanowires can realize self-healing after 15-30 min. The method plays a vital role for long service life and high reliability of high-performance parts of high-performance equipment, even can avoid disastrous fracture and failure of devices and equipment, and provides a unique thought and method for design and manufacture of high-performance SiC devices and equipment.

After self-healing, a second fracture strength test is conducted; the nanowires are loaded; the displacement control mode is used; loading rate is 0.5-15 nm/s; and displacement is 0-100 nm. After self-healing, the fracture strength of the healed single crystal SiC nanowires is tested through the in-situ TEM mechanical tension test method, which is very important for assessment of service life and reliability of the single crystal SiC devices and equipment. The loading rate is 0.5-15 nm/s in order to obtain a high-resolution TEM micrograph of atomic dimension. The displacement is 0-100 nm in order to fracture the healed single crystal SiC nanowires to obtain the fracture strength.

Partial recrystallization is found at a fracture after self-healing through in-situ TEM representation; and a fractured position after healing is the same as the position before healing. The high-resolution TEM micrographs of atomic dimension at the healed fracture extracted from dynamic loading and unloading videos show that, partial recrystallization is found at the healed fracture, which is the basic principle of self-healing. Because of partial recrystallization, the fracture strength of the fracture after self-healing is lower than the fracture strength of the single crystal. Thus, a fractured position after healing is the same as the fracture position before healing.

The fracture strength of the single crystal nanowires after self-healing is 1-2.5 GPa; and the recovery ratio of the fracture strength is 10-20%. The in-situ TEM nanomechanical tension test result shows that, the fracture strength of the single crystal SiC nanowires after self-healing is 1-2.5 GPa, while the fracture strength of the single crystal nanowires is 12-15 GPa. Therefore, the recovery ratio of the fracture strength after self-healing is 10-20%.

The present invention has the effects and the benefits that for the fractured single crystal SiC nanowires, self-healing of the fractured nanowires is realized without any external intervention, and recrystallization is found at the healed fracture.

DETAILED DESCRIPTION

Figure 1:
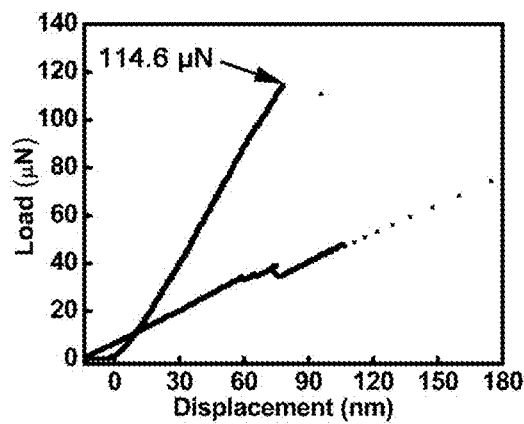
FIG. 1 shows loading and unloading curves of in-situ TEM tension test of single crystal SiC nanowires.

Specific embodiments of the present invention are further described below in combination with accompanying drawings and the technical solution.

A self-healing method for fractured single crystal SiC nanowires realizes self-healing of single crystal nanowires without external intervention, wherein:

(1) single crystal SiC nanowires have a diameter of 60-90 nm;

(2) one end of a Chinese brush pen of yellow weasel's hair is fixed to a mobile platform of an optical microscope using conductive silver epoxy; the Chinese brush pen realizes millimeter movement and micrometer movement through the mobile platform; a yellow weasel's hair at the other end of the Chinese brush pen of yellow weasel's hair moves and transfers nanowires to place the nanowires on an in-situ mechanical microtest apparatus of a TEM;

(3) both ends of the nanowires are fixed to the microtest apparatus using conductive silver epoxy;

(4) the microtest apparatus is installed on an in-situ TEM nanomechanical test system; an in-situ nanomechanical tension test is realized in a TEM;

(5) the nanowires are loaded; a displacement control mode is used; loading rate is 0.5-15 nm/s; displacement is 0-200 nm;

(6) fracture strength of the single crystal nanowires is 12-15 GPa;

(7) after the nanowires are fractured, unloading causes a slight contact between the fractured end surfaces; the load of the end surfaces is 0; the electron beam is shut off; self-healing of the nanowires is conducted after waiting for 15-30 min in a vacuum chamber of the TEM;

(8) after self-healing, a second fracture strength test is conducted; the nanowires are loaded; the displacement control mode is used; loading rate is 0.5-15 nm/s; displacement is 0-100 nm;

(9) partial recrystallization is found at a fracture after self-healing through in-situ TEM representation; a fractured position after healing is the same as the position before healing;

(10) The fracture strength of the single crystal nanowires after self-healing is 1-2.5 GPa; and the recovery ratio of the fracture strength is 10-20%.

Embodiments 3C-single crystal SiC nanowires have a diameter of 80-90 nm are selected as self-healing material. The single crystal nanowires are placed in an acetone solution for ultrasonic dispersion for 30-50 s. A 200-mesh copper grid having a plastic film and a diameter of 3 mm and used for preparing a TEM sample is used; and the plastic film on the copper grid is ignited with a cigarette lighter to remove the film. Then, the copper grid without the film is clamped with tweezers and is subjected to ultrasonic cleaning in the acetone solution for 15-25 s to remove traces and pollution on the copper grid. After ultrasonic cleaning for the copper grid is completed, the copper grid is clamped with the tweezers to gain SiC nanowires from the SiC acetone solution of ultrasonic dispersion. The copper grid is placed on the mobile platform of an optical microscope. After acetone evaporates, the nanowires appear on the surface of the copper grid. The nanowires are found from the optical microscope and are focused clearly. The tail end of the Chinese brush pen of yellow weasel's hair is fixed to another optical microscope. A clip is straightened, turns red by burning on a candle, and makes a hole at the lower part in a plastic brush cap of the Chinese brush pen of yellow weasel's hair. One yellow weasel's hair is threaded out from the hole, and other yellow weasel's hairs are covered with the plastic brush cap. Three-dimensional millimeter and micrometer movement of a single yellow weasel's hair are realized through the mobile platform of the optical microscope. Under another optical microscope, the nanowires are moved and transferred through electrostatic attraction between the yellow weasel's hair and the nanowires, and are placed on the in-situ TEM mechanical microtest apparatus. The tip of the yellow weasel's hair is dipped in a small drop of conductive silver epoxy, and the conductive silver epoxy is respectively dropped on both ends of the nanowires. After the conductive silver epoxy is solidified, the nanowires can be fixed to the microtest apparatus.

Figure 2:
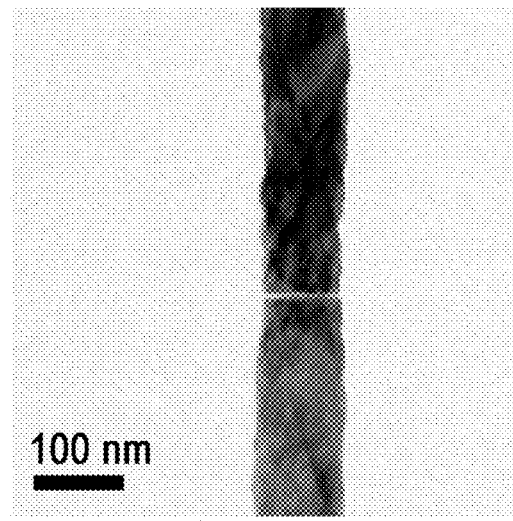
FIG. 2 is a TEM micrograph of a self-healing fracture of single crystal SiC nanowires after self-healing.
Figure 3:
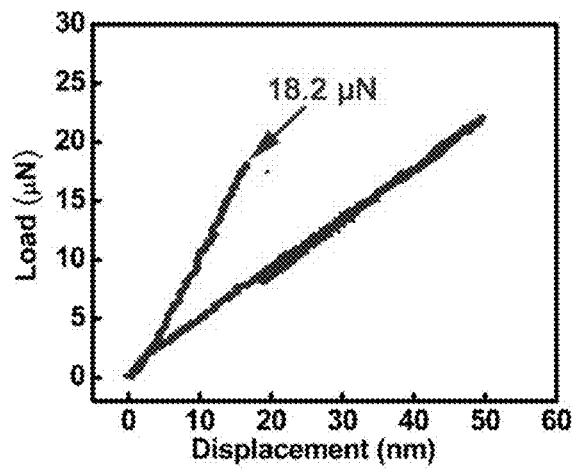
FIG. 3 shows in-situ TEM tension loading and unloading curves of single crystal SiC nanowires after self-healing.

The microtest apparatus is placed in the in-situ nanomechanical test system of PI 95 TEM PicoIndenter. The test system is inserted into FEI Tecnai F20 FETEM. Operation voltage is 200 kV. The fracture strength test is conducted on the nanowires through an in-situ TEM tension test method. A displacement control mode is used; loading rate is 4 nm/s; and displacement is 0-180 nm. Loading and unloading curves are shown in FIG. 1. After the test, the fracture strength of the single crystal SiC nanowires is 13.4 GPa. The nanowires are unloaded, and the end surfaces of the fractured single crystal SiC nanowires come into slight contact, with a load of 0. The electron beam is shut off; and self-healing of the single crystal SiC nanowires is conducted after waiting for 20 min. After 20 min, the electron beam is turned on to shoot a TEM micrograph of the fracture after self-healing, as shown in FIG. 2. It is found that recrystallization occurs at the fracture after self-healing. Then, the in-situ TEM fracture strength test is conducted on the SiC nanowires after healing. A loading mode is a displacement control mode. The loading rate is 4 nm/s; and displacement is 0-60 nm. Loading and unloading curves of the fracture strength test of the SiC nanowires after self-healing are shown in FIG. 3. The test result shows that the fracture strength of the single crystal SiC nanowires after self-healing is 1.7 GPa; and the recovery ratio of the fracture strength is 12.7%.

We claim:
1. A self-healing method for fractured single crystal SiC nanowires, realizing self-healing of single crystal nanowires without external intervention, the method comprising:
   (1) providing the single crystal SiC nanowires having a diameter of 60-90 nm;
   (2) fixing one end of a yellow weasel's hair taken from a Chinese brush pen to a mobile platform of an optical microscope using a conductive silver epoxy; operating a millimeter and micrometer movement of the yellow weasel's hair through the mobile platform; moving and transferring the single crystal SiC nanowires to an in-situ transmission electron microscope (TEM) mechanical testing device using an other end of the yellow weasel's hair;
   (3) fixing both ends of the single crystal SiC nanowires to the TEM mechanical testing device using the conductive silver epoxy;
   (4) installing the TEM mechanical testing device on an in-situ TEM nanomechanical test holder; an in-situ nanomechanical tension testing is realized in the TEM;
   (5) loading the single crystal SiC nanowires using a displacement control mode; wherein a loading rate is 0.5-15 nm/s; a displacement is 0-200 nm;
   (6) fracturing the single crystal SiC nanowires by tension, wherein fractured surfaces are formed; a fracture strength of the single crystal SiC nanowires is 12-15 GPa;
   (7) after the single crystal SiC nanowires are fractured, unloading the single crystal SiC nanowires, wherein the unloading causes a contact between the fractured surfaces; a load of end surfaces is 0; shutting off electron beam in TEM; conducting a self-healing of the single crystal SiC nanowires after waiting for 15-30 min in a vacuum chamber of the TEM;
   (8) after the self-healing, conducting a second in-situ TEM mechanical tension testing; wherein the single crystal SiC nanowires are loaded; the displacement control mode is used; the loading rate is 0.5-15 nm/s; the displacement is 0-100 nm;
   wherein partial recrystallization is found at the fractured surfaces after the self-healing through in-situ TEM representation; a fractured position after healing is the same as the fractured position before healing;
   wherein the fracture strength of the single crystal SiC nanowires after the self-healing is 1-2.5 GPa; and a recovery ratio of the fracture strength is 10-20%.

* * * * *